(12) United States Patent
Doan et al.

(10) Patent No.: US 9,190,589 B2
(45) Date of Patent: Nov. 17, 2015

(54) LIGHT EMITTING DIODE

(71) Applicant: SemiLEDs Optoelectronics Co., Ltd., Miao-Li County (TW)

(72) Inventors: Trung-Tri Doan, Hsinchu County (TW); Chao-Chen Cheng, Miao-Li County (TW); Yi-Feng Shih, Miaoli County (TW)

(73) Assignee: SemiLEDS Optoelectronics Co., Ltd., Chu-Nan (TW)

( * ) Notice: Subject to any disclaimer, the term of this patent is extended or adjusted under 35 U.S.C. 154(b) by 0 days.

(21) Appl. No.: 13/799,342

(22) Filed: Mar. 13, 2013

(65) Prior Publication Data

US 2014/0061585 A1 Mar. 6, 2014

(30) Foreign Application Priority Data

Aug. 30, 2012 (CN) .......................... 2012 1 0316440

(51) Int. Cl.
*H01L 33/64* (2010.01)
*H01L 25/075* (2006.01)
*H01L 33/62* (2010.01)

(52) U.S. Cl.
CPC ............ *H01L 33/64* (2013.01); *H01L 25/0753* (2013.01); *H01L 33/62* (2013.01); *H01L 2924/0002* (2013.01)

(58) Field of Classification Search
CPC . H01L 33/00; H01L 33/0008; H01L 33/0012; H01L 33/002; H01L 33/36; H01L 33/38; H01L 33/48; H01L 33/387
See application file for complete search history.

(56) References Cited

U.S. PATENT DOCUMENTS

| | | | | |
|---|---|---|---|---|
| 7,846,755 | B2 * | 12/2010 | Kal et al. ........................ | 438/34 |
| 8,241,932 | B1 * | 8/2012 | Yu et al. ......................... | 438/28 |
| 2008/0179602 | A1 * | 7/2008 | Negley et al. ................... | 257/88 |
| 2008/0185606 | A1 * | 8/2008 | Sano et al. ...................... | 257/98 |
| 2010/0163887 | A1 * | 7/2010 | Kim et al. | |
| 2010/0163900 | A1 * | 7/2010 | Seo et al. ........................ | 257/98 |
| 2010/0187548 | A1 * | 7/2010 | Onushkin et al. ............... | 257/88 |
| 2011/0210351 | A1 * | 9/2011 | Kim et al. ....................... | 257/89 |

* cited by examiner

*Primary Examiner* — Peniel M Gumedzoe
(74) *Attorney, Agent, or Firm* — Stephen A. Gratton

(57) ABSTRACT

The present invention provides a light emitting diode, which comprises a first LED die and a second LED die, each die comprising a first semi-conductive layer, a second semi-conductive layer, and a multiple quantum well layer disposed between the first and the second semi-conductive layers, wherein the first semi-conductive layer of the first LED die is coupled to the second semi-conductive layer of the second LED die so as to form a serially connected structure whereby the consuming current and heat generation of the light emitting diode are lowered so that the size of heat dissipating device for the light emitting diode can be reduced and illumination of the light emitting diode can be enhanced.

7 Claims, 2 Drawing Sheets

LIGHT EMITTING DIODE

FIELD OF THE INVENTION

The present invention relates to a light emitting diode, and more particularly, to a light emitting diode with serially connected structure.

BACKGROUND OF THE INVENTION

With rapid technical progress in light emitting diode (LED) technology, LEDs nowadays present many advantages over incandescent light sources including lower energy consumption, longer lifetime, smaller size, and lighter in weight. Recently, light emitting diodes are available in a wide range of colors with the most common being RED, BLUE and GREEN and are thus widely used in the backlight modules for displaying devices, such as cellular phones and LCDs. Nevertheless, heat dissipation is always the main issue restricting the improvement in LED luminous efficiency. Thus, with rising power output, it has grown increasingly necessary to shed excess heat with efficient heat transfer to maintain reliability for all LED manufacturers.

When a conventional LED is excited by the flow of current, generally the temperatures of components in the LED can be raised to above normal due to leakage current effect inside the semiconductor die of the LED and also inefficient heat transfer from the semiconductor die to the surrounding environment. Such above-normal temperature not only will cause damage to the components and speed the aging of the same as well, but also the optical properties of the LED are going to change with the temperature variation. For instance, the power output of an LED may reduce with the increasing of its temperature. In addition, as the color of light emitted from an LED, and thus its wavelength is determined by the energy gap of it semiconductor die, and since the energy gap is varying with the temperature variation of the semiconductor die, the wavelength of light emitted from the LED will change with the temperature variation.

In view of the heat dissipation problem that are common to the conventional LEDs, it is in need of an innovative LED that is able to reduce the leakage current and lower the in the LED economically and effectively.

Conventionally, as a voltage of 3V is usually the voltage required for exciting an LED, the drivers for LED excitation generally are configured with a voltage conversion circuit for dropping voltage to 3V from 110V. However, since the driver will have to be built large enough so as to accommodate the voltage conversion circuit, the application flexibility of LEDs is diminished.

SUMMARY OF THE INVENTION

The present invention provides a light emitting diode, which has a serially connected structure formed by coupling the semi-conductive layers of two LED dies that are arranged neighboring to each other inside the light emitting diode, whereby the consuming current and heat generation of the light emitting diode are lowered so that the size of heat dissipating device for the light emitting diode can be reduced and illumination of the light emitting diode can be enhanced.

The present invention provides a light emitting diode, which has a serially connected structure formed by coupling a p-type semi-conductive layer of one LED dies with an n-type semi-conductive layer of another LED dies while the two LED dies are arranged neighboring to each other inside the light emitting diode, whereby the consuming current and heat generation of the light emitting diode are lowered so that the size of heat dissipating device for the light emitting diode can be reduced and illumination of the light emitting diode can be enhanced.

In an exemplary embodiment, the present invention provides a light emitting diode, which comprises a first LED die and a second LED die, each die comprising a first semi-conductive layer, a second semi-conductive layer, and a multiple quantum well layer disposed between the first and the second semi-conductive layers, wherein the first semi-conductive layer of the first LED die is coupled to the second semi-conductive layer of the second LED die.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

Figure 1:
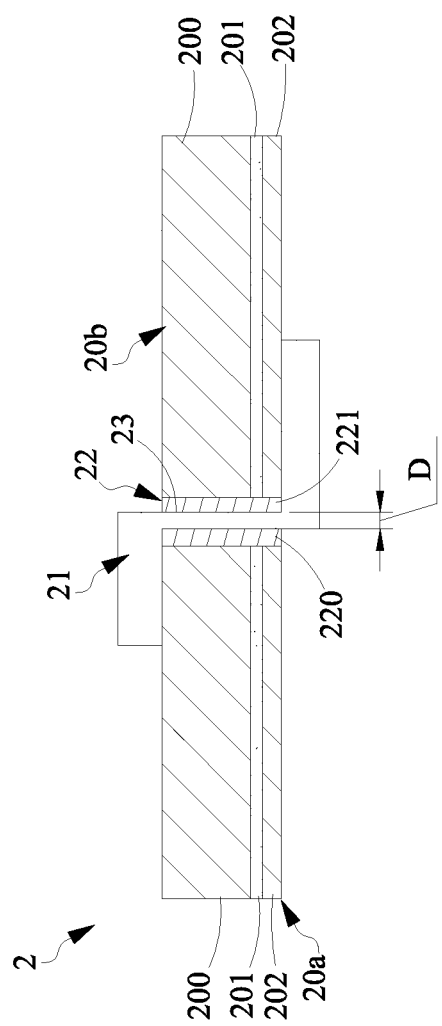
FIG. 1 is a schematic diagram showing a light emitting diode according to an embodiment of the present invention.

Please refer to FIG. 1, which is a schematic diagram showing a light emitting diode according to an embodiment of the present invention. As the cross section shown in FIG. 1, the light emitting diode 2 comprises: a first LED die 20a and a second LED die 20b, in which each of the first and the second LED dies 20a and 20b is comprised of: a first semi-conductive layer 200, a second semi-conductive layer 202, and a multiple quantum well (MQW) layer 201, and the MQW layer 201 is disposed sandwiching between the first and the second semi-conductive layers 200, 202 while engaging to the two layers 200, 202. In this embodiment, the first semi-conductive layer 200 is disposed engaging to the upper surface of the MQW layer 201 while allowing the second semi-conductive layer 202 to be disposed engaging to the bottom surface of the MQW layer 201.

It is noted that the first semi-conductive layer 200 can be a p-type semi-conductive layer or an n-type semi-conductive layer. In an embodiment when the first semi-conductive layer 200 is substantially a p-type semi-conductive layer, correspondingly the second semi-conductive layer 202 should be an n-type semi-conductive layer; and vice versa, when the first semi-conductive layer 200 is substantially an n-type semi-conductive layer, correspondingly the second semi-conductive layer 202 should be a p-type semi-conductive layer. Moreover, the p-type semi-conductive layer can be made of a p-type III-nitride material, such as p-GaN, p-AlGaN, p-AlGaInN, p-InGaN, p-AlN, and the like, but is not limited thereby. In this embodiment, p-AlN is selected to be used as the material for making the p-type semi-conductive layer in the present invention. Similarly, the n-type semi-conductive layer can be made of a n-type III-nitride material, such as n-GaN, n-InGaN, n-AlGaInN, n-AlInGaN, and the like, but is not limited thereby. In this embodiment, n-GaN is selected to be used as the material for making the n-type semi-conductive layer in the present invention. As for the MQW layer 201, it can be made of a semiconductor material, such as GaAs and AlGaAs. In addition, the three-layer structure of the aforesaid first semi-conductive layer 200, second semi-conductive layer 202 and MQW layer 201 can be formed and achieved using a method selected from the group consisting of: a method of metal-organic chemical vapor deposition (MOCVD), a method of molecular beam epitaxy (MBE), a method of vapor phase epitaxy (VPE) and the like. Thereafter, the three-layer structure is further being processed by a method selected from the group consisting of: a method of dry etching, a method of wet etching, a method of reactive ion etching (RIE) or a method of laser etching, so as to be formed into the corresponding LED die.

As shown in FIG. 1, the first semi-conductive layer 200 of the first LED die 20a is coupled to the second semi-conductive layer 202 of the second LED die 20b. In the embodiment, there is further an insulation component 22 formed at a position between the first LED die 20a and the second LED die 20b, and the insulation component 22 is being divided into a first insulation element 220 and a second insulation element 221 by a via hole 23 formed thereon. Moreover, such insulation component 22 can be made of a material selected from the group consisting of: $SiO_2$, $Si_3N_4$, $TiO_2$, $Al_2O_3$, $HfO_2$, $Ta_2O_5$, a photo resistance (PR) material, and an epoxy, and the like. In addition, the insulation component 22 is formed in the light emitting diode 2 using a deposition method, such as chemical vapor deposition (CVD), plasma enhanced CVD (PECVD), atomic layer deposition (ALD), printing or coating. In this embodiment, the first insulation element 220 and the second insulation element 221 are made of the same material, while the via hole 23 is formed on the insulation component 22 by a method selected from the group consisting of: a method of dry etching, a method of wet etching, a method of reactive ion etching (RIE), a method of laser etching and a method of lithography. Moreover, the via hole 23 is formed with a diameter D that is smaller than 1000 μm. In one embodiment of the invention, the diameter D of the via hole 23 is smaller than 200 μm, while in another embodiment, the diameter D of the via hole can be smaller than 100 μm. It is noted that although in the embodiment shown in FIG. 1, the first insulation element 200 and the second insulation element 221 are made of the same material, but in another embodiment, the first insulation element 200 and the second insulation element 221 can be made of different materials.

In this embodiment, the coupling of the first semi-conductive layer 200 of the first LED die 20a to the second semi-conductive layer 202 of the second LED die 20b is achieved using an electrode assembly 21 by way of the via hole 23. As shown in FIG. 1, the first LED die 20a is insulated from the electrode assembly 21 by the first insulation element 220; while the second LED die 20b is insulated from the electrode assembly 21 by the second insulation element 221. In an embodiment, the electrode assembly 21 is coupled and engaged to a portion of the first semi-conductive layer 200 of the first LED die 20a, and is also simultaneously coupled and engaged to a portion of the second semi-conductive layer 202 of the second LED die 20b. It is noted that the electrode assembly 20 is made of a conductive metal in a form of a single metal layer, or a multiple metal layers. It is noted that any one layer in either the single metal layer or the multiple metal layers can be made of a conductive material, so as to achieve a formation, such as Cr/Au, Cr/Al, Cr/Pt/Au, Cr/Ni/Au, Cr/Al/Pt/Au, Cr/Al/Ni/Au, Ti/Al, Ti/Au, Ti/TiW/Au. Ti/Al/Pt/Au, TiW/Au, Ti/Al/Ni/Au, NiV/Au, Al, Al/Pt/Au, Al/Pt/Al, Al/Ni/Au, Al/Ni/Al, Al/W/Al, Al/W/Au, Al/TaN/Al, Al/TaN/Au, Al/Mo/Au, or Ti/NiV/Au, whereas any Au used in the foregoing structure can be replaced by Cu.

Figure 2:
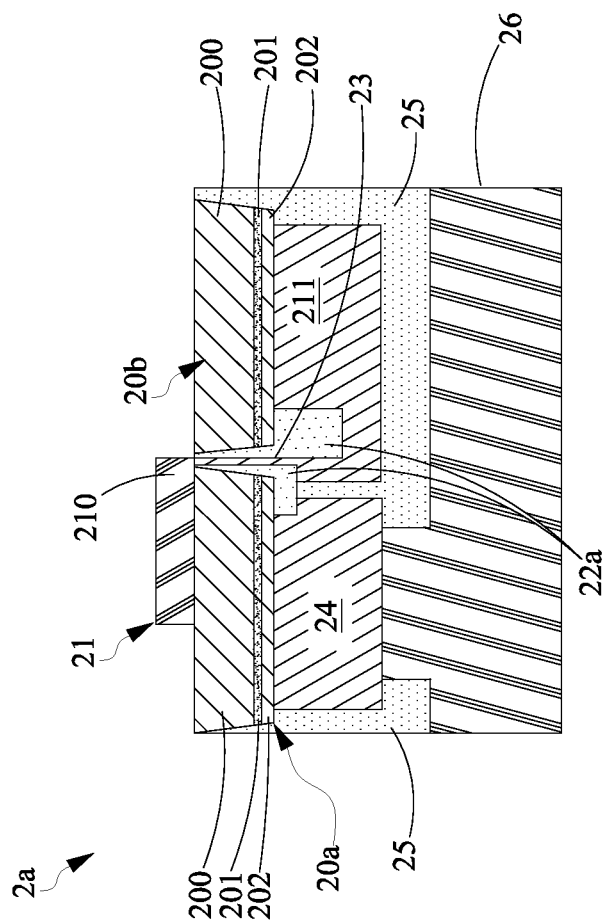
FIG. 2 is a schematic diagram showing a light emitting diode according to another embodiment of the present invention.

Please refer to FIG. 2, which is a schematic diagram showing a light emitting diode according to another embodiment of the present invention. In the embodiment shown in FIG. 2, the light emitting diode 2a comprises: a first LED die 20a and a second LED die 20b, in which both the first LED die 20a and the second LED die 20b are structured and arranged the same as those described in the embodiment shown in FIG. 1, and thus will not be described further herein. In the embodiment of FIG. 2, the first semi-conductive layer 200 is an n-type semi-conductive layer, while the second semi-conductive layer 202 is a p-type semi-conductive layer. Similarly, there is also an insulation component 22a formed at a position between the first LED die 20a and the second LED die 20b; and also the insulation component 22a is formed with a via hole 23. As the insulation component 22a is made of a material the same as the one described in the embodiment shown in FIG. 1, it is not described further herein. In the embodiment shown in FIG. 2, the electrode assembly 21 is similarly disposed for allowing the same to connect to the first semi-conductive layer 200 of the first LED die 20 and the second semi-conductive layer 202 of the second LED die 20b by way of the via hole 23. In addition, in this embodiment, the electrode assembly 21 includes a first electrode 210 and a second electrode 211, whereby the first electrode 210 is formed on the first semi-conductive layer 200 of the first LED die 20a, and the second electrode 211 is formed on the second semi-conductive layer 202 of the second LED die 20b while allowing the same to electrically connect to the first electrode by an extension of the second electrode 211 that is disposed extending through the via hole 23.

Moreover, there is further a third electrode 24 disposed attaching to the bottom of the second semi-conductive layer 202 of the first LED die 20a, whereas the third electrode 24 is insulated from the second electrode by the use of a second insulation component 25. Similarly, the first insulation component 22a and the second insulation component 25 can respectively be made of a material selected from the group consisting of: $SiO_2$, $Si_3N_4$, $TiO_2$, $Al_2O_3$, $HfO_2$, $Ta_2O_5$, a photo resistance (PR) material, and an epoxy, and the like. In addition, each of the first and the second insulation component 22a, 25 is formed in the light emitting diode 2 using a deposition method, such as chemical vapor deposition (CVD), plasma enhanced CVD (PECVD), atomic layer deposition (ALD), printing or coating. It is noted that the first insulation component 22a and the second insulation component 25 can be made of the same material or different materials according to actual requirement. Moreover, the first electrode 210, the second electrode 211 and the third electrode 24 can be made of a material that can be selected from the same group for the electrode assembly 21 as described in the embodiment shown in FIG. 1, and thus will not described further herein. In addition, the third electrode 24 is further connected to a metallic alloy component 26 that is engaged to the bottom of the third electrode 24, whereas the metallic alloy component 26 is made of an ally composed of at least two metals selected from the group consisting of: Cu, Ni, Ag, Co, Al, Sn, W, Mo, Pd, Pt, Rh. The method of achieving and forming such metallic alloy component 26 in the light emitting diode 2a can be a means selected from the group consisting of: sputtering, PVD, electroplating, electroless plating, printing and the like. It is noted that if the second semi-conductive layer 202 is selected to be a p-type semi-conductive layer, the third electrode 24 should be a p-type electrode; and vice versa, if the second semi-conductive layer 202 is selected to be an n-type semi-conductive layer, the third electrode 24 should be a n-type electrode. Moreover, although the serially connected structures in the previous two embodiments of the present invention are illustrated using only two LED dies, but it is not limit thereby in actual application, i.e. there can be more than two LED dies forming the serially connected structures that is described in the present invention.

When any of the aforesaid light emitting diodes 2 and 2a is being excited by a flow of current, there is almost no leakage current inside the light emitting diode of the invention. Moreover, by the serially connected structure achieved by the coupling of the first semi-conductive layer 200 of the first LED die 20a to the second semi-conductive layer 202 of the second LED die 20b, the consuming current and heat generation of the light emitting diode are lowered so that the size of heat dissipating device for the light emitting diode can be reduced and illumination of the light emitting diode can be enhanced.

In addition, the light emitting diode of the present invention is designed to be excited by a voltage of 12V. Consequently, a lamination device that is composed of two light emitting diodes of the present invention will require a 24V driving circuit, a lamination device that is composed of three light emitting diodes of the present invention will require a 36V driving circuit, and so forth. Thus, the size of the drivers for exciting the LED can be reduced since the corresponding voltage conversion circuit required in the driving circuit of the present invention is smaller than that of a conventional LED. Since the size of heat dissipating device and also that of the driver for the light emitting diode of the present invention are reduced, the usage flexibility of the light emitting diode of the present invention is enhance and thus the field of application of the light emitting diode is widened.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A light emitting diode comprising:
   a first LED die and a second LED die, each die comprising a first semi-conductor layer, a second semi-conductor layer, and a multiple quantum well layer between the first semi-conductor layer and the second semi-conductor layer;
   an insulation component between the first LED die and the second LED die comprising a first insulation element configured to contact and electrically insulate the first LED die and a second insulation element configured to contact and electrically insulate the second LED die, the first insulation element and the second insulation element comprising a same deposited material; and
   an electrode assembly comprised of a conductive metal, the electrode assembly comprising a via hole extending through the insulation component from the first semi-conductor layer on of the first LED die to the second semi-conductor layer of the second LED die, a conductive material in the via hole comprised of a first portion of the conductive metal electrically insulated by the insulation component, a first electrode comprised of a second portion of the conductive metal continuous with the first portion of the conductive metal in electrical contact with the first semi-conductor layer on of the first LED die and electrically insulated from the second semi-conductor layer of the first LED die by the first insulation element, and a second electrode comprised of a third portion of the conductive metal continuous with the second portion of the conductive metal in electrical contact with the second semi-conductor layer of the second LED die and electrically insulated from the first semi-conductor layer of the second LED die by the second insulation element.

2. The light emitting diode of claim 1 wherein the conductive metal comprises a single metal layer.

3. The light emitting diode of claim 1 wherein the conductive metal comprises a stack comprised of multiple metal layer.

4. The light emitting diode of claim 1 wherein the insulation component comprises a material selected from the group consisting of $TiO_2$, $Al_2O_3$, $HfO_2$, $Ta_2O_5$, a photo resist, and an epoxy.

5. The light emitting diode of claim 1 further comprising a third electrode separate from the first electrode and the second electrode in electrical contact with the second semi-conductor layer of the first LED die, and the insulation component further comprises a third insulation element configured to electrically insulate the third electrode from the second electrode.

6. The light emitting diode of claim 5 further comprising a metallic alloy component in electrical contact with the third electrode.

7. The light emitting diode of claim 6 further comprising a second insulating component separate from the insulation component configured to electrically insulate the metallic alloy component from the second electrode.

* * * * *